US005171987A

United States Patent [19]

Waldron et al.

[11] Patent Number: 5,171,987

[45] Date of Patent: Dec. 15, 1992

[54] COMBINED MAGNETIC SECTOR MASS SPECTROMETER AND TIME-OF-FLIGHT MASS SPECTROMETER

[75] Inventors: John D. Waldron, Sale; Mark G. Dowsett, Balsall Common; Peter J. Derrick, Leamington Spa, all of England

[73] Assignee: Kratos Analytical Ltd., Urmston, England

[21] Appl. No.: 671,368

[22] Filed: Mar. 19, 1991

[30] Foreign Application Priority Data

Mar. 21, 1990 [GB] United Kingdom ................. 9006303

[51] Int. Cl.[5] ........................ B01D 59/44; H01J 37/26

[52] U.S. Cl. .................................... 250/281; 250/283; 250/287; 250/307; 250/309

[58] Field of Search ............... 250/281, 282, 283, 287, 250/300, 288, 306, 307, 309

[56] References Cited

U.S. PATENT DOCUMENTS

| | | | |
|---|---|---|---|
| 3,686.499 | 8/1972 | Omura et al. | 250/309 |
| 3,894,233 | 7/1975 | Tamura et al. | 250/307 |
| 4,472,631 | 9/1984 | Enke et al. | 250/281 |
| 4,818,872 | 4/1989 | Parker et al. | 250/309 |

FOREIGN PATENT DOCUMENTS

| | | | |
|---|---|---|---|
| 2338452 | 6/1975 | Fed. Rep. of Germany . | |
| 2217907 | 1/1989 | United Kingdom . | |
| 8809051 | 11/1988 | World Int. Prop. O. | 250/309 |

OTHER PUBLICATIONS

Nuclear Instruments and Methods on Physics Research. B 233 (1984) Nov., No. 2 Amsterdam NL pp. 185-192 L R Kilius et al. Charge Ratio Mass Spectrometry of Heavy Elements.

*Primary Examiner*—Jack I. Berman
*Assistant Examiner*—James Beyer
*Attorney, Agent, or Firm*—Leydig, Voit & Mayer

[57] ABSTRACT

A mass spectrometry system includes a double-focusing magnetic sector mass spectrometer and a time-of-flight spectrometer arranged in parallel. The spectrometers share a common means for exciting ions from a sample, and a common transfer optics system. An interleaved control system for the two spectrometers, is arranged also to control a sampling handling arrangement dependent on the output of the time-of-flight spectrometer, so as to enable the double-focusing magnetic sector mass spectrometer to analyze a region of interest on a sample.

18 Claims, 1 Drawing Sheet

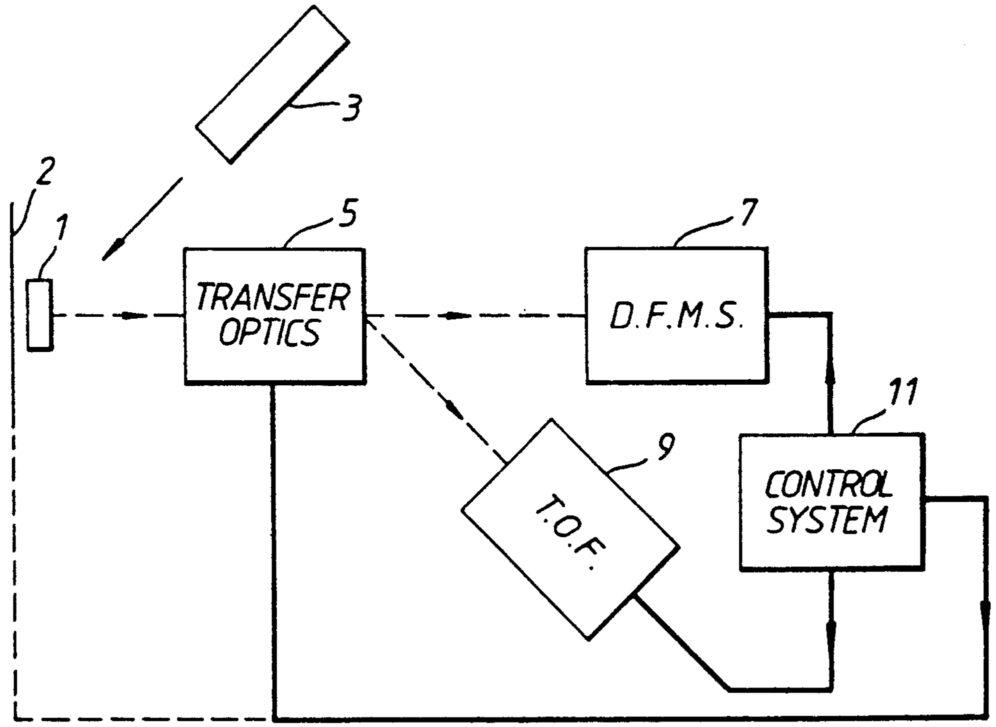
3
2
1
5
TRANSFER OPTICS
7
D.F.M.S.
11
CONTROL SYSTEM
9
T.O.F.

COMBINED MAGNETIC SECTOR MASS SPECTROMETER AND TIME-OF-FLIGHT MASS SPECTROMETER

BACKGROUND OF THE INVENTION

1. Field of the Invention

This invention relates to mass spectrometry systems. In recent years there has arisen a need to analyze small sample volumes. This need arises, for example, where there is only a limited quantity of a unique sample, the sample being distributed in a particulate or other form in a matrix. Thus modern materials analysis problems require a spatial resolution over the sample region of 1 micron or less, together with the ability to find the specific locations of the sample in the matrix prior to analysis.

2. Description of the Prior Art

Most known magnetic sector or quadrupole mass spectrometry systems do not include means for lateral imaging of the sample surface combined with precise means of sample manipulation controlled through the image. Those that do, consume significant amounts of sample material in the process thus destroying the areas from which detailed information is sought.

SUMMARY OF THE INVENTION

It is an object of the present invention to provide a mass spectrometry system which is capable of locating a sample within a matrix but which also makes an efficient use of the ions emitted by the sample.

According to a first aspect of the present invention there is provided a mass spectrometry system for analysis of a sample including means for generating and collecting ions from the sample, the system being characterized in that it comprises a magnetic sector mass spectrometer with a time-of-flight mass spectrometer configured so that ions from a common field of view may be analyzed by either spectrometer sequentially, a control system and a transfer optics system under the control of the control system, the transfer optics system being effective to collect ions from the sample under conditions suitable for either spectrometer and to match the ions into either spectrometer sequentially under the direction of the control system.

According to a second aspect of the present invention there is provided a method of using a mass spectrometry system for analysis of a sample including the steps of generating and collecting ions from the sample, the method being characterized in that it uses a magnetic sector mass spectrometer and a time-of-flight mass spectrometer configured so that ions from a common field of view may be analyzed by either spectrometer sequentially, the method including the step of directing the ions into either of the spectrometers sequentially by means of a transfer optics system under the control of a control system, the transfer optics system being effective to collect ions from the sample under conditions suitable for either spectrometer, and to match the ions into the spectrometers.

BRIEF DESCRIPTION OF THE DRAWINGS

One embodiment of a mass spectrometry system in accordance with the invention will now be described, by way of example only, with reference to the accompanying drawing which is a schematic diagram of a mass spectrometry system in accordance with the embodiment of the invention.

DESCRIPTION OF THE PREFERRED EMBODIMENT

Referring to the Figure, the mass spectrometry system in accordance with the present invention, to be described comprises a sample holder 1, whose position may be adjusted by use of a sample handling arrangement 2. A source 3 is arranged so as to be capable of ablating and ionizing atoms or molecules from a sample mounted on the sample holder. A transfer optics system 5 is arranged to focus ions from the sample, either into a double-focusing magnetic sector mass spectrometer 7, hereinafter referred to as a DFMS, or into a time-of-flight mass spectrometer 9, hereinafter referred to as a TOF. The DFMS 7 and TOF 9 are both operated under control of an interleaved control system 11, which is also arranged to control the sample handling system 2 and the operation of the transfer optics 5 so as to direct ions either towards the DFMS 7 or the TOF 9.

The source 3 may take any suitable form, and in particular may comprise a combination of different primary probes dependent on the likely applications of the system. Thus the system may be configured as a secondary ionization mass spectrometer (SIMS) system, the source 3 being arranged to produce pulsed and/or continuous primary ion beams to stimulate ion emission from the sample carried by the sample holder 1. The source 3 may alternatively or additionally include a fine laser probe or a micro-focus pulsed primary ion probe.

The transfer optics system 5 is capable of matching a two or three dimensional source having a large energy spread into the TOF 9 or DFMS 7. The transfer optics system 5 is arranged to combine a high efficiency screened extraction field with optical gating and dynamic emittance matching. This will ensure that the DFMS 7 can be operated so as to have high mass resolution from a small sample area, typically less than 10 microns, without significant transmission losses of the ions through the system. The transfer optics system 5 ensures that the field of view of the DFMS can be scanned across a larger sample area in synchronization with the scanning action of the source 3 over the sample area. The lens design of the transfer optics system 5 will take account of the need to prevent excessive temporal pulse spreading so as to maintain high resolution in the TOF 9. In practice this will necessitate, at least temporarily, operating the ion optical elements in what is known as the "accelerating mode". In some circumstances, however, the ion optical elements will be operated in a retarding mode.

It will be appreciated that the screened extraction field of the transfer optics system 5 will enable the fields on insulating samples to be reduced, thus improving the performance possible for the analysis of insulating samples.

By floating a primary ion probe 3 at the screen or sample potentials, it will also be possible to cause low energy primary ions to impinge within the spectrometers' fields of view.

It will be seen that by having the TOF 9 and the DFMS 7 in parallel, the TOF can be used to locate the areas of interest on a sample before using the DFMS 7 for a variety of localized analysis functions. Thus the sample may be initially scanned with a micro-focused pulsed primary ion probe, such imaging requiring the consumption of extremely small quantities of the sample but yielding spatial information across a wide mass range. As the TOF 9 Possesses nearly absolute mass calibration it can also be used to determine the mass range of interest present in the sample. The source 3 may then be switched to a continuous excitation mode, the control system 11 causing the transfer optics system 5 to switch the ion beam emitted from the system 5 from the TOF 9 to the DFMS 7. The DFMS 7 is then used to perform a more detailed analysis of the sample with a high mass resolution over a limited mass range as determined by the use of the TOF 9. The control system 11 may be arranged to maintain a record of the variation in intensity of the signals measured by the spectrometers 7 and/or 9 as a function of the position on the sample from which the ions have originated, together with an indication of the accumulated flux.

An alternative mode of operation for the parallel combination of the TOF 9 and the DFMS 7 is to switch rapidly between the TOF and the DFMS. This mode of operation will, for example, enable low dose imaging of buried features to be alternated with high sensitivity depth profiling.

Although the DFMS is shown located on the axis of the transfer optics system 5 in the spectrometry system shown in FIG. 1 it will be appreciated that many other configurations are possible. If however, both spectrometers are located off axis, further deflection means will be necessary to direct the ions from the transfer optics system 5 to the two spectrometers 7, 9.

The output of the TOF 9 will be used by the control system 11 to control the sampling handling system 2 to bring the desired sample area into the field of view of the transfer optics system 5. By linking the sample handling arrangement 2 to the control system 11, regions of interest in the sample may be selected in real time for detailed analysis. Typically, the sampling handling arrangement must be capable of orthogonal movements of up to 25 mm amplitude, with a precision of up to 1 micron.

It will be appreciated that the parallel system described herebefore finds particular application in the semiconductor industry, for example in the analysis of fully and part processed semiconductor wafers and semiconductor materials.

It will be appreciated that in some applications it may be advantageous to combine a series arrangement comprising a magnetic sector mass spectrometer and a time-of-flight spectrometer, together with an appropriate transfer optics system and control system, with a parallel arrangement of spectrometers in accordance with the invention in a single spectrometry system.

It will also be appreciated that whilst the magnetic sector mass spectrometer described by way of example is an energy focussing spectrometer, in particular a double-focussing magnetic sector mass spectrometer, other forms of magnetic sector mass spectrometers may be used in a system in accordance with the invention.

It will be appreciated that the means for generating ions from the sample may take any suitable form. These include ion beams, fast atom beams, and electron beams all operated in either a pulsed or continuous mode, and a pulsed laser.

It will also be appreciated that the transfer optics system may take any suitable form. Whilst a quadrupole system may be appropriate in some circumstances, other electrode structures which lack cylindrical symmetry may also be used.

It will also be appreciated that a mass spectrometry system in accordance with the invention may also incorporate other components if necessary. In particular, such a parallel spectrometer system may include a buncher which uses electrodynamic bunching, or other means, to produce short pulses of ions suitable for the time-of-flight spectrometer, the magnetic sector mass spectrometer using a continuous ion beam. Furthermore, an electron beam may be used for the purpose of charge neutralization at the sample surface.

What we claim is:

1. A mass spectrometry system for analysis of a sample including means for generating and means for collecting ions from the sample, a magnetic sector mass spectrometer, and a time-of-flight mass spectrometer configured so that ions from a common field of view may be analyzed by either spectrometer sequentially, a control system and a transfer optics system under the control of the control system, the transfer optics system being effective to collect ions from the sample under conditions suitable for either spectrometer and to match the ions into either spectrometer sequentially under the direction of the control system.

2. A mass spectrometry system according to claim 1 in which the control system is capable of measuring the signal from either spectrometer in such a way as to maintain a record of the variation in intensity of the signals as a function of the position on the sample from which the ions have originated, and the accumulated flux.

3. A mass spectrometry system according to claim 1 in which the control system is capable of selecting the area of the sample to be analyzed.

4. A mass spectrometry system according to claim 1 in which the magnetic sector mass spectrometer is an energy focussing magnetic sector mass spectrometer.

5. A mass spectrometry system according to claim 1 in which the means for generating comprises a combination of different probes.

6. A mass spectrometry system according to claim 1 in which the means for generating includes means for scanning across the sample so as to excite ions from different areas of the sample, and means for scanning the field of view of the spectrometers in synchronization with the scanning action of the means for generating.

7. A mass spectrometry system according to claim 1 including means for causing the time-of-flight spectrometer to locate areas of interest on the sample prior to using the magnetic sector mass spectrometer for localized analysis functions.

8. A mass spectrometry system according to claim 1 including means for enabling the time-of-flight mass spectrometer to locate masses of interest within the sample prior to detailed analysis of said masses using the magnetic sector mass spectrometer.

9. A mass spectrometry system according to claim 1 in which the fields of view of the spectrometers are limited by the transfer optics system.

10. A method of using a mass spectrometry system for analysis of a sample including the steps of generating and collecting ions from the sample, and using a magnetic sector mass spectrometer and a time-of-flight mass spectrometer configured so that ions from a common field of view may be analyzed by either spectrometer sequentially, the method including the step of directing the ions into either of the spectrometers sequentially by means of a transfer optics system under the control of a control system, the transfer optics system being effective to collect ions from the sample under conditions suitable for either spectrometer, and to match the ions into the spectrometers.

11. A method according to claim 10 including measuring the signal from either spectrometer in such a way as to maintain a record of the variation in intensity of the signal as a function of the originating position on the sample and the accumulated flux of the means for generating the ions from the sample.

12. A method according to claim 10 in which the control system selects the area of the sample to be analyzed.

13. A method according to claim 10 in which the time-of-flight mass spectrometer is used to locate an area of interest on the sample prior to detailed analysis of the area using the magnetic sector mass spectrometer.

14. A method according to claim 10 in which the time-of-flight mass spectrometer is used to locate a mass of interest on the sample prior to detailed analysis of the mass using the magnetic sector mass spectrometer.

15. A mass spectrometry system for analysis of a sample including means for generating and collecting ions from the sample, a magnetic sensor mass spectrometer, and a time-of-flight mass spectrometer configured so that ions from a common field of view may be analyzed by either spectrometer sequentially, a control system and a transfer optics system under the control of the control system, the transfer optics system being effective to collect ions from the sample under conditions suitable for either spectrometer and to match the ions into either spectrometer sequentially under the direction of the control system, the system including means for causing the time-of-flight mass spectrometer to locate areas of interest on the sample prior to using the magnetic sector mass spectrometer for localized analysis functions.

16. A mass spectrometry system for analysis of a sample including means for generating and collecting ions from the sample, a magnetic sector mass spectrometer, and a time-of-flight mass spectrometer configured so that ions from a common field of view may be analyzed by either spectrometer sequentially, a control system and a transfer optics system under the control of the control system, the transfer optics system being effective to collect ions from the sample under conditions suitable for either spectrometer and to match the ions into either spectrometer sequentially under the direction of the control system, the system including means for enabling the time-of-flight mass spectrometer to locate masses of interest within the sample prior to detailed analysis of said masses using the magnetic sector mass spectrometer.

17. A method of using a mass spectrometry system for analysis of a sample including the steps of generating and collecting ions from the sample, and using a magnetic section mass spectrometer and a time-of-flight mass spectrometer configured so that ions from a common field of view may be analyzed by either spectrometer sequentially, the method including the step of directing the ions into either of the spectrometers sequentially by means of a transfer optics system under the control of a control system, the transfer optics system being effective to collect ions from the sample under conditions suitable for either spectrometer, and to match the ions into the spectrometers, the time-of-flight mass spectrometer being used to locate an area of interest on the sample prior to detailed analysis of the area using the magnetic mass sector mass spectrometer.

18. A method of using a mass spectrometry system for analysis of a sample including the steps of generating and collecting ions from the sample, and using a magnetic sector mass spectrometer and a time-of-flight mass spectrometer configured so that ions from a common field of view may be analyzed by either spectrometer sequentially, the method including the step of directing the ions into either of the spectrometers sequentially by means of a transfer optics system under the control of a control system, the transfer optics system being effective to collect ions from the sample under conditions suitable for either spectrometer, and to match the ions into the spectrometers, the time-of-flight mass spectrometer being used to locate a mass of interest on the sample prior to detailed analysis of the mass using the mass sector mass spectrometer.

* * * * *